(12) United States Patent
Bedeschi et al.

(10) Patent No.: US 12,725,650 B2
(45) Date of Patent: Sep. 1, 2026

(54) MEMORY DEVICE HAVING UNITY BUFFERS WITH OUTPUT CURRENT LIMITERS

(71) Applicant: Micron Technology, Inc., Boise, ID (US)

(72) Inventors: Ferdinando Bedeschi, Biassono (IT); Pierguido Garofalo, San Donato Milanese (IT); Michele Maria Venturini, Milan (IT)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 18/480,207

(22) Filed: Oct. 3, 2023

(65) Prior Publication Data

US 2024/0170049 A1 May 23, 2024

Related U.S. Application Data

(60) Provisional application No. 63/384,382, filed on Nov. 18, 2022.

(51) Int. Cl.

| | |
|---|---|
| ***G11C 11/4093*** | (2006.01) |
| ***G11C 11/4078*** | (2006.01) |
| ***G11C 11/4096*** | (2006.01) |

(52) U.S. Cl.

CPC ...... *G11C 11/4093* (2013.01); *G11C 11/4078* (2013.01); *G11C 11/4096* (2013.01)

(58) Field of Classification Search

CPC .............................. G11C 11/403; G11C 11/40

USPC ...................................................... 365/189.5

See application file for complete search history.

(56) References Cited

U.S. PATENT DOCUMENTS

| | | | | |
|---|---|---|---|---|
| 5,642,072 | A * | 6/1997 | Miyamoto | G11C 5/145 327/543 |
| 2004/0150464 | A1* | 8/2004 | Khalid | H03F 3/45475 327/541 |
| 2006/0170473 | A1* | 8/2006 | Childers | H03K 17/165 327/170 |
| 2009/0224829 | A1* | 9/2009 | Johansson | H03F 3/72 330/252 |

* cited by examiner

*Primary Examiner* — Muna A Techane
(74) *Attorney, Agent, or Firm* — Greenberg Traurig

(57) ABSTRACT

Systems, methods, and apparatus related to unity buffers in memory devices. In one approach, a memory device includes memory arrays having memory cells. The memory device includes access lines to access the memory cells. The memory device includes unity buffers to drive the access line loads. Each buffer has an output current limiter that limits current flow when driving a voltage on the access lines. By limiting the current, the current limiter provides improved frequency response and operating stability for the buffer without the need for a compensation net.

20 Claims, 12 Drawing Sheets

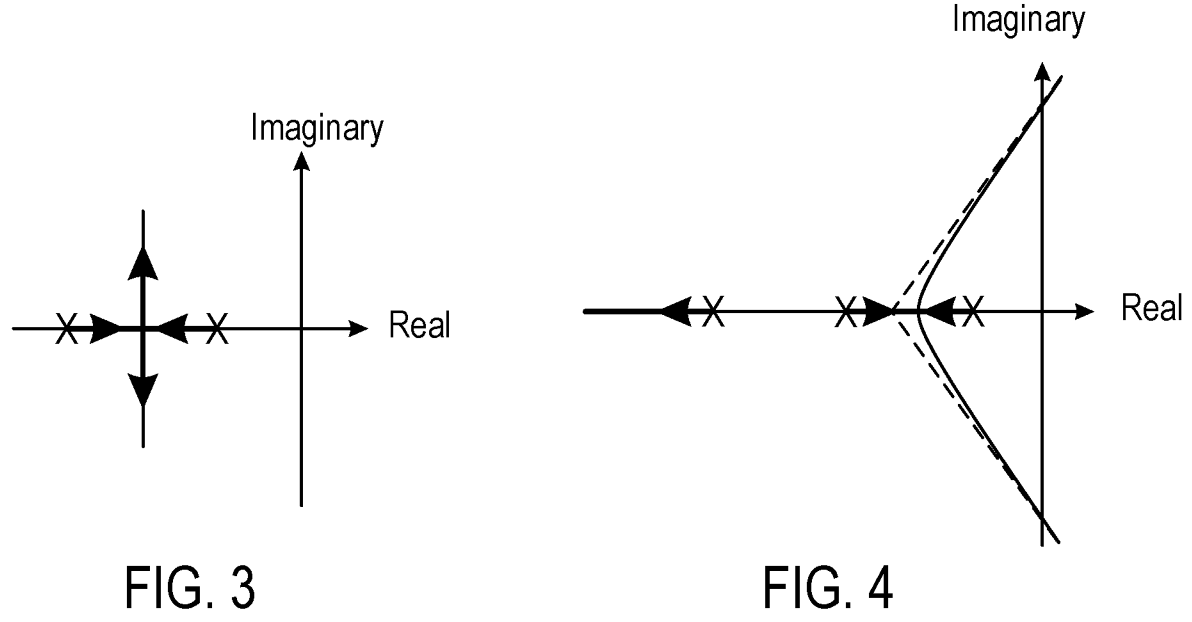
FIG. 3
FIG. 4
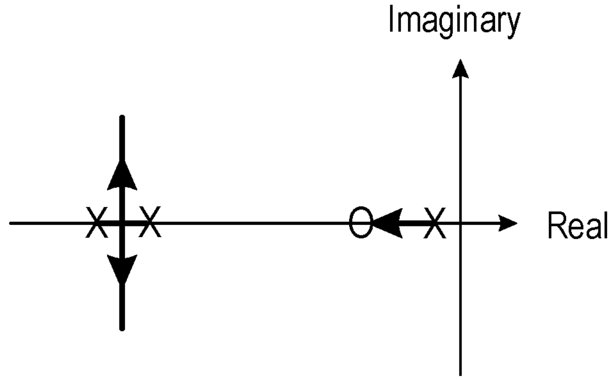
FIG. 5

MEMORY DEVICE HAVING UNITY BUFFERS WITH OUTPUT CURRENT LIMITERS

RELATED APPLICATIONS

The present application claims priority to Prov. U.S. Patent Application Ser. No. 63/384,382 filed Nov. 18, 2022, the entire disclosures of which application are hereby incorporated herein by reference.

FIELD OF THE TECHNOLOGY

At least some embodiments disclosed herein relate to memory devices in general, and more particularly, but not limited to memory devices having unity buffers with output current limiters.

BACKGROUND

Various types of non-volatile memory devices can be used to store data. For example, typical computer storage devices have controllers that receive data access requests from host computers and perform programmed computing tasks to implement the requests (e.g., in ways that are specific to the media and structure configured in the storage devices).

Firmware can be used to operate a controller for a particular memory device. In one example, when a computer system or device reads data from or writes data to the memory device, it communicates with the controller.

The controller generates various signals during operation of the memory device. Some of these signals are provided as inputs to buffer amplifiers (e.g., unity buffers) used to drive access lines and/or other loads in the memory device.

In one example, a voltage buffer amplifier is used to transfer a voltage from a first circuit to a second circuit. The buffer amplifier prevents the second circuit from loading the first circuit unacceptably and interfering with its desired operation. If the voltage is transferred essentially unchanged (e.g., the voltage gain is 1), the amplifier is a unity gain buffer (or simply unity buffer). It is also sometimes referred to as a voltage follower because the output voltage follows or tracks the input voltage.

BRIEF DESCRIPTION OF THE DRAWINGS

The embodiments are illustrated by way of example and not limitation in the figures of the accompanying drawings in which like references indicate similar elements.

FIGS. 3-7 show exemplary pole-zero plots (sometimes referred to as root-locus plots) that depict closed-loop amplifier transfer function pole positions as the open-loop amplifier gain varies (this in turn defines closed-loop amplifier stability).

DETAILED DESCRIPTION

Figure 1:
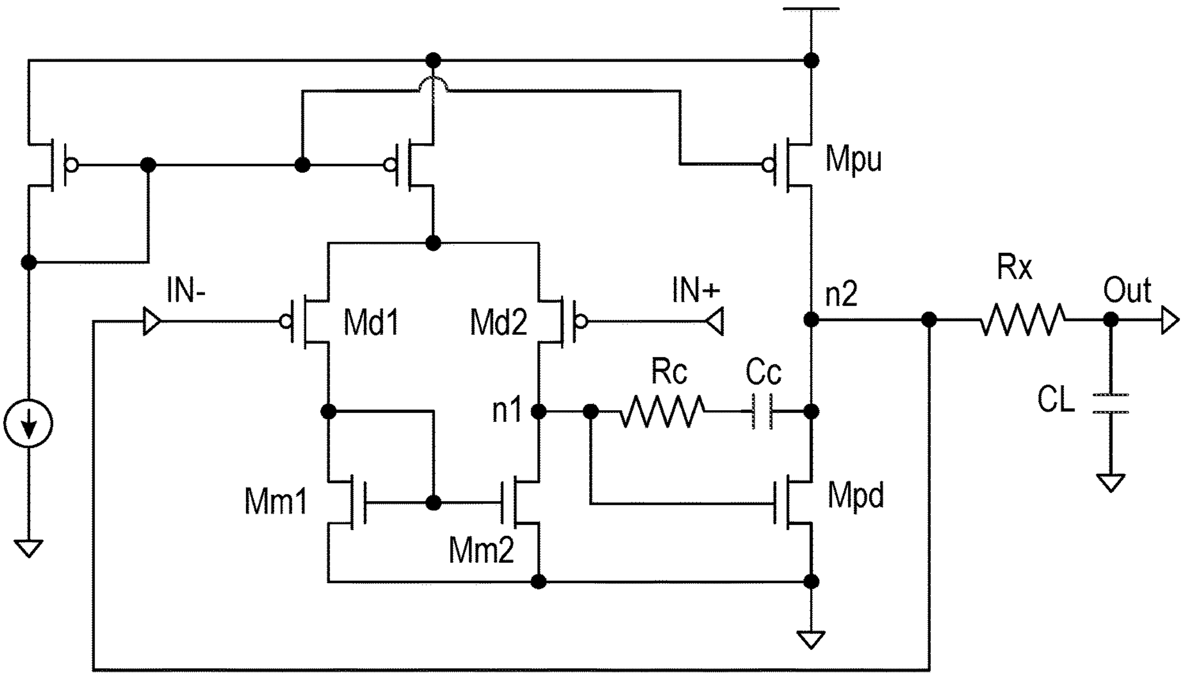
FIG. 1 shows an exemplary unity buffer that uses a compensation net.

The following disclosure describes various embodiments for memory devices having unity buffers with output current limiters. At least some embodiments herein relate to a memory device (e.g., a memory device using phase change memory cells). The memory device may, for example, store data used by a host device (e.g., a computing device of an autonomous vehicle, or another computing device that accesses data stored in the memory device). In one example, the memory device is a solid-state drive mounted in an electric vehicle.

In some cases, unity buffers are used in memory devices to drive various loads. A compensation net is used in an effort to improve the frequency response and stability of operation of the unity buffer. However, the use of the compensation net causes several problems. For example, the compensation net uses one or more resistors and capacitors that consume a large amount of area on a semiconductor chip. Also, the compensation net can limit slew rates of the buffer.

To address these and other technical problems, a unity buffer uses a current limiter at the output of the unity buffer. The compensation net is not needed, and thus is not included in the unity buffer circuit configuration. In one example, the current limiter limits a discharge current when pulling a wordline or bitline down to a negative voltage.

Replacing the compensation net by use of the current limiter can provide one or more advantages for a unity buffer. Exemplary advantages include one or more of the following: reducing required area for the buffer, reducing bias current used by the buffer, reducing ringing of the output signal from the buffer, and/or increasing slew rates for the output from the buffer.

Also, the unity buffer is configured to have a preferential sweep direction (e.g., output voltage changing from high to low, or low to high), with the recovery of the output occurring more slowly (e.g., when resetting the buffer for a next read or write operation of the memory device). It should be noted that a unity buffer can be designed so that the sweep direction is preferential for a sweep direction of either high to low, or low to high. In some cases, the direction of the preferential sweep can be changed by reverting the configuration of the unity buffer.

In one embodiment, a memory device includes one or more memory arrays, each including memory cells. In one example, the memory cells are chalcogenide cells arranged in a three-dimensional cross-point array. The memory device includes access lines (e.g., wordlines or bitlines) configured to access the memory cells. In other examples, the memory cells can be NAND or NOR flash memory cells.

The memory device includes one or more buffers positioned to drive loads at various locations of the memory array(s). Each buffer includes a differential stage having an two inputs (e.g., a non-inverting input and an inverting input), and an output stage having an amplified output that is responsive to the input (e.g., changes in input voltage). Each buffer has a current limiter configured to couple the output of the buffer to one or more access lines (and/or other loads). The current limiter limits current flow when driving a voltage on the access lines. By limiting the current, the current limiter improves the stability of the output signal from the buffer.

FIG. 1 shows an exemplary unity buffer that uses a compensation net. A differential stage of the buffer includes transistors Md1, Md2, Mm1, Mm2 (e.g., configured in couples that are identical between themselves). An output stage of the buffer includes transistor Mpd, and an output of the buffer is provided at node n2. The output drives capacitive load CL.

The compensation net is coupled between a differential stage and an output stage of the buffer. The compensation net includes resistor Rc and capacitor Cc.

As mentioned above, the area on a chip required by the compensation net is significant. This problem is compounded by the need in some cases to include numerous buffers (e.g., 64 or 128 buffers) in a single memory device.

In some cases, when using a unity buffer, signal setting or load driving requires node voltages to follow monotonic fast sweeps (e.g., from high-to-low voltages or the opposite). Recovery sweeps (e.g., resetting of the state of the unity buffer) can use much slower ramps. In some examples, these sweeps need to approach a step, or Heaviside, function.

In some memory devices, numerous buffers are used. In one example, a multiplicity of buffer instantiations is used in a memory device having memory arrays that are fractionated in several sub-arrays. If the buffers each use a compensation net, the area needs are significant.

As illustrated, the unity buffer architecture has its output (Out) connected to provide a feedback signal to its inverting input (IN−) of the differential stage. The compensation net limits slew rates of the illustrated buffer. In one example, for a high-to-low sweep the output buffer n-channel pull-down transistor Mpd is effective. However, to ease the overall stability of the unity buffer, the output buffer pull-up current provided by p-channel transistor Mpu should typically not be made too small.

In one example, capacitive buffer load CL may also have in parallel a current load on the output Out. For example, a memory cell may exhibit switching when reaching a certain voltage level (e.g., threshold voltage), which can cause the current load. This current load generally does not change the stability discussion below.

Figure 2:
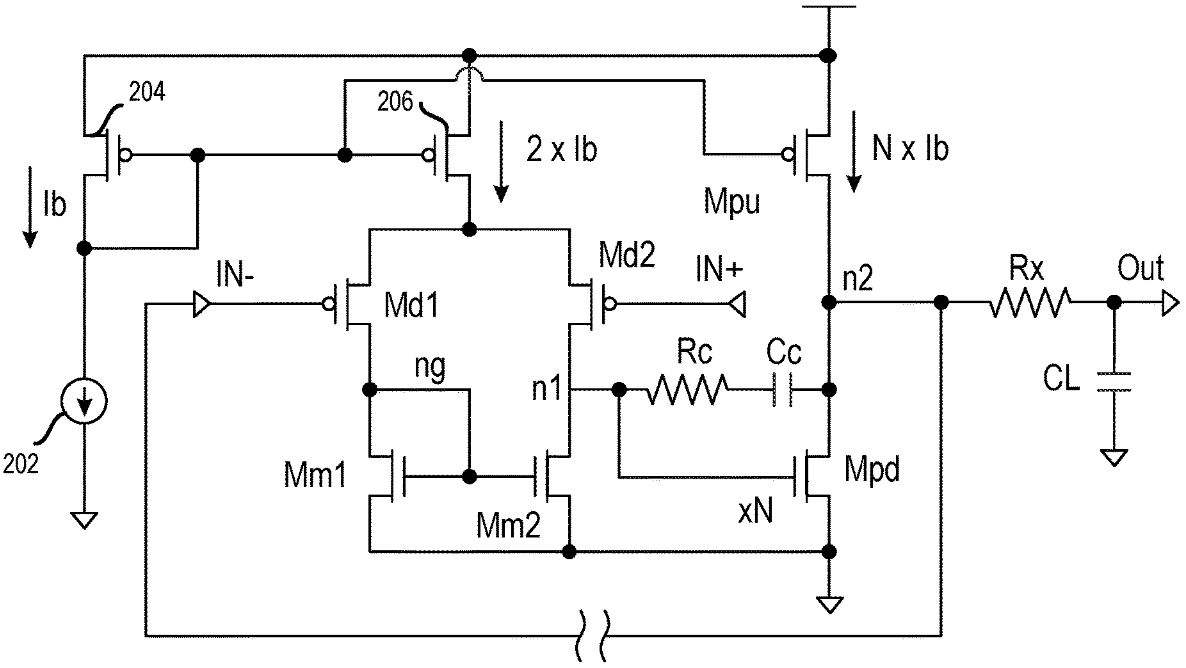
FIG. 2 shows an exemplary unity buffer with a broken feedback loop for determining loop gain.

FIG. 2 shows an exemplary unity buffer with a broken feedback loop for determining loop gain. The unity buffer includes a bias generator reference diode connected transistor 204 for providing bias current to the differential stage and the output stage. In some cases, the bias generator reference is located at a different location on a chip than the location of a number of instances of the unity buffer in a memory device. A reference current is provided by current source 202 to provide reference current Ib.

The bias generators include transistors 206 and transistor Mpu. A current mirror configuration is used to provide, for example, a current 2×Ib to the differential stage, and a current N×Ib to the output stage. These currents can be configured as desired by varying the sizes of transistors 206 and Mpu (e.g., there can be a number N of transistor instantiations with the same dimensions of transistors 204 and Mm1 or Mm2).

The closed-loop stability of the unity buffer can be evaluated by determining the open loop gain of the unity buffer. The open loop gain is determined by breaking the feedback loop between node n2 and inverting input IN−, as illustrated.

FIGS. 3-7 show exemplary pole-zero plots (sometimes referred to as root-locus plots) that depict closed-loop amplifier transfer function pole positions as the open-loop amplifier gain varies (this in turn defines closed-loop amplifier stability) for various configurations of the unity buffer of FIG. 2. Regarding FIG. 3, consider Cc=0 and Rx=0 for a standard buffer case (note that the value of Rc does not affect the analysis here). A simplified loop gain can be expressed as follows:

$$L(s) = \frac{vn2}{vin} = \frac{gm_d ro_1 gm_{pd} ro_2}{(1 + s \cdot ro_1 C_1) \cdot (1 + s \cdot ro_2 C_L)}$$

where:

$$C1 = Cdb_{Md2} + Cbd_{Mm2} + Cgs_{Mpd}$$

For example, as per stability theory, according to the effective middle band (often zero frequency) open-loop gain value, closed-loop (transfer function) poles move from open-loop ones (open-loop gain equal to zero) toward open-loop zeros and/or, as usual when in excess of the zeros, toward “infinite” (open-loop gain “equal to infinite”). The stability of the closed-loop transfer function is guaranteed if its poles fall within the root-locus left half plane (that is, the real part of all poles is negative). Accordingly, the buffer should always be stable, as per the root locus illustrated in FIG. 3.

The above simplified expression does not consider higher frequency buffer poles. However, these neglected higher frequency buffer poles are able to bend the root locus in the right plane (to the right of the vertical imaginary axis), as depicted by the didactic additive single pole as illustrated in FIG. 4. The closed-loop poles in the right plane can cause buffer instability. Thus, the buffers (and in general the operational amplifiers in a feedback configuration), almost always need one (or more) compensation net(s). The didactic additive single pole is associated, for example, with other capacitances (not shown) of the buffer.

Figure 6:
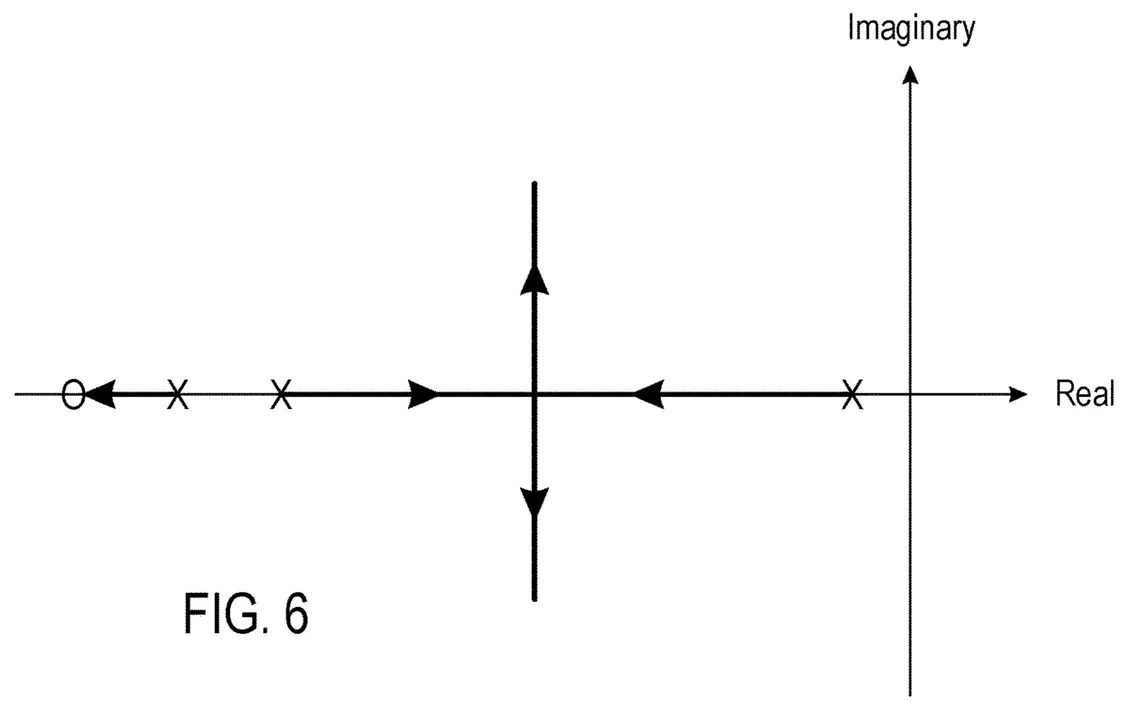

Regarding FIGS. 5 and 6, the loop gain expression above is now considered again with capacitance Cc and resistance Rc greater than zero. The introduction of Cc moves the second pole to the left as illustrated. However, this also moves the first pole to the right (dominant pole at low frequency). The foregoing allows greater phase margin at unity gain frequency (e.g., in a Bode diagram used to ascertain closed-loop configuration). Or, as discussed above, the foregoing allows keeping the closed-loop poles within the root-locus left half plane.

To avoid use of Cc alone, which would introduce a malicious zero in the right-half plane, the value of resistance Rc is greater than zero, which allows the shifting of the zero to the left half plane, as illustrated in FIGS. 5 and 6. FIG. 5 represents the case when the zero is related to the first dominant pole and is located to its left. When the zero is located to the right (not shown), the situation is similar.

FIG. 6 illustrates the case when the zero is close to the third pole and is to its left. When the zero is located to its right (not shown), the situation is similar. In both cases illustrated in FIGS. 5 and 6, the buffer is always stable.

However, as mentioned earlier, using a compensation net having components Cc and Rc requires significant area overhead. For example, Cc may need to have a value of about CL/3, as given by the following expression:

$$CL \cdot gm_d/gm_{pd} \text{ (independent of } Ib) \cong CL/3$$

Also, for example, the buffer slew rate is given by 2Ib/Cc. Cc has a minimal value for stability, while Ib is also desired to be minimized. As a result, the slew rate becomes small, and the response to a step input becomes an undesirably slow ramp. Further, when Cc is close to its low limit, the buffer can exhibit persistent overshoots and undershoots (e.g., ringing).

As mentioned above, these problems can be addressed by removing the compensation net and instead using a current limiter, as discussed in various embodiments below.

Figure 7:
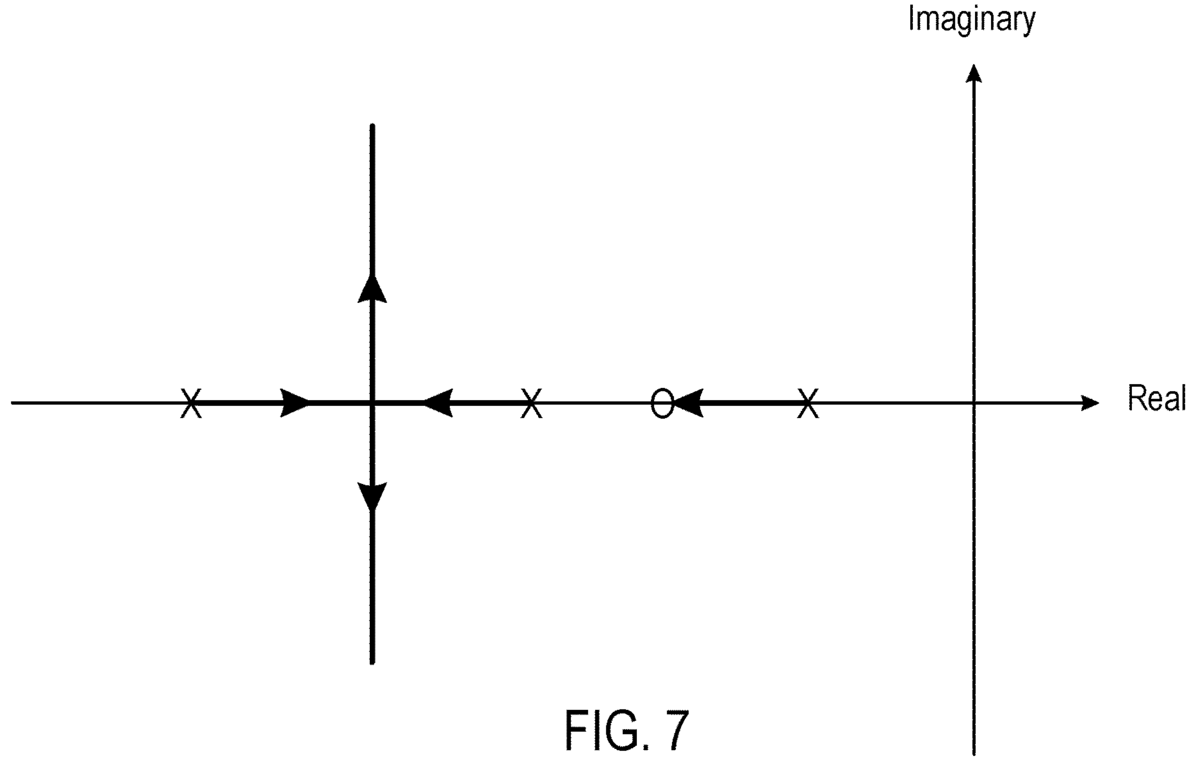

FIG. 7 illustrates a root-locus plot for a unity buffer configuration (see FIG. 1) in which the compensation net is removed. This is evaluated by setting values of Rc and Cc to zero (Cc=0 and Rc=0). A simplified open loop gain (where the value Rx is not zero) can then be expressed as follows:

$$L(s) = \frac{vn2}{vin} = \frac{gm_d ro_1 gm_{pd} ro_2 \cdot (1 + sR_x C_L)}{(1 + s \cdot ro_1 C_1) \cdot (1 + s \cdot (ro_2 + R_x) C_L)}$$

In the above expression, there are two poles as illustrated in FIG. 7. Also, the didactic additive single pole of FIG. 4 is maintained, as also illustrated in FIG. 7. The use of resistor Rx introduces one zero in the loop gain function that aids stability of operation for the buffer. It can be noted that as Rx becomes larger, the zero and pole both move towards the origin of the pole-zero plot. The zero tends to annihilate the CL pole as Rx becomes larger. In other words, the decoupling between the buffer output and its load CL, to its maximal extension the opening of the connection (meaningless as it prevents the load driving), helps to stabilize the system, even without the use of a compensation network.

Figure 8:
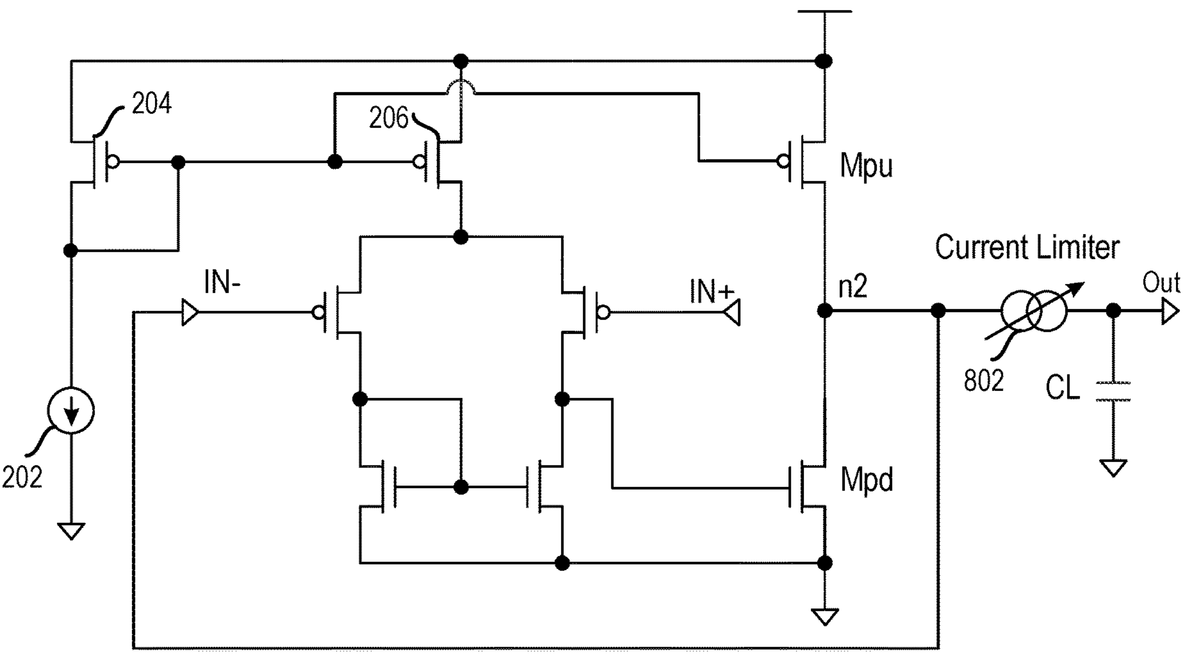
FIG. 8 shows a unity buffer having a current limiter at an output of the unity buffer, in accordance with some embodiments.
Figure 9:
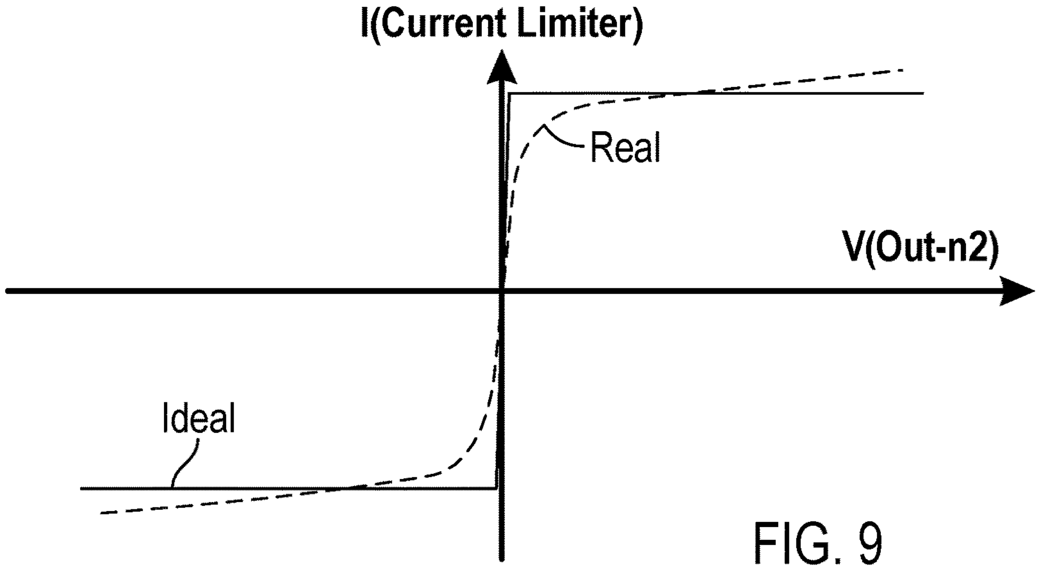
FIG. 9 shows an exemplary I-V curve for a current limiter of a unity buffer.

FIG. 8 shows a unity buffer having a current limiter 802 at an output of the unity buffer, in accordance with some embodiments. Current limiter 802 is inserted between an output of the output stage of the unity buffer and the load driven by the unity buffer. The dominant pole compensation provided by the compensation net above is not needed, and thus removed. FIG. 9 shows an exemplary I-V curve for current limiter 802.

The illustrated unity buffer is designed for a preferential high-to-low output voltage sweep. For a preferential low-to-high voltage sweep, a similar architecture can be used in which n-channel transistors are used in the bias generator, and a p-channel pull-up transistor is used to provide gain transmission in the output stage.

Even with the compensation net removed, the use of current limiter 802 provides sufficient stability during operation. The current limiter provides a high output resistance, which supports stability. The use of the current limiter can provide one or more advantages of reduced area, improved slew rate performance, and/or ability of operating at low current biases. These advantages can vary by design.

Figure 10:
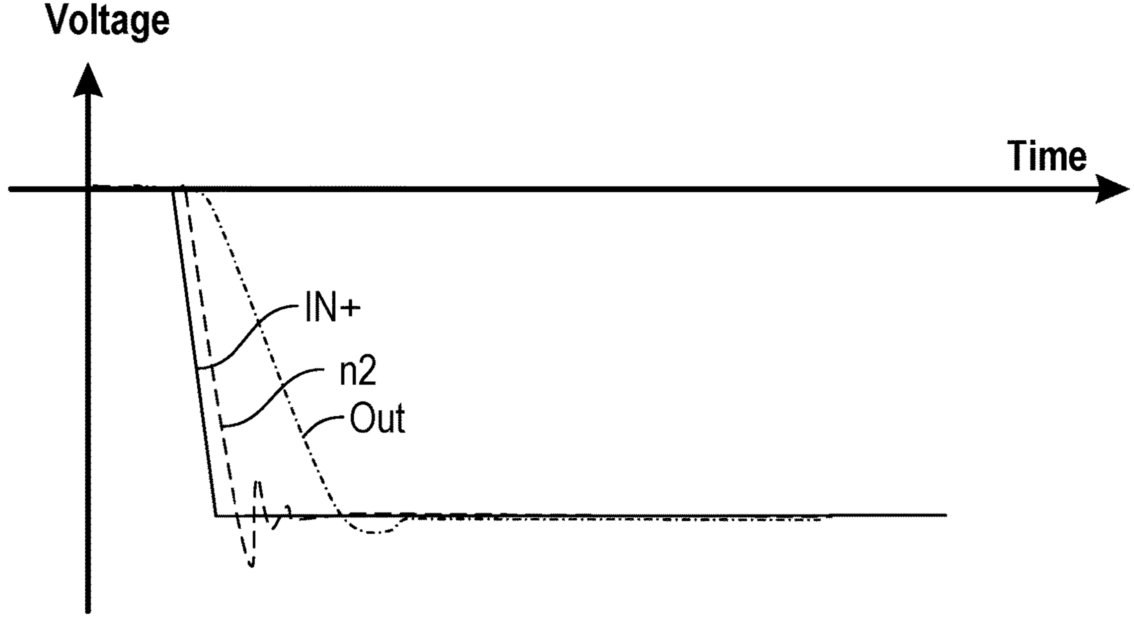
FIG. 10 shows exemplary voltage waveforms for input and output signals of a unity buffer using a current limiter.

FIG. 10 shows exemplary voltage waveforms for input and output signals of a unity buffer using current limiter 802 (e.g., the unity buffer of FIG. 8). An input signal IN+ is provided as a decreasing step voltage. Node n2 is pulled down in response fairly quickly by transistor Mpd.

In response to IN+, node n2 settles rapidly with little ringing. This is because transistor Mpd sees a limited current (due to current limiter 802) and does not overreact by pulling down node n2 excessively. As a consequence, this avoids a need to wait for transistor Mpu to remediate with its reduced pull-up force.

The output of the current limiter Out settles with a desirable pace soon afterwards, as illustrated. The output signal Out has significantly reduced ringing. In some cases, there may be no ringing of the output signal Out.

For recovery of the unity buffer, transistor Mpu can be smaller so that node n2 is not pulled up so quickly. This helps to reduce the bias current needed at the output stage. The foregoing poses an upper limit to the level of current limiting to optimize the effective settling time for suitable operation.

Figure 11:
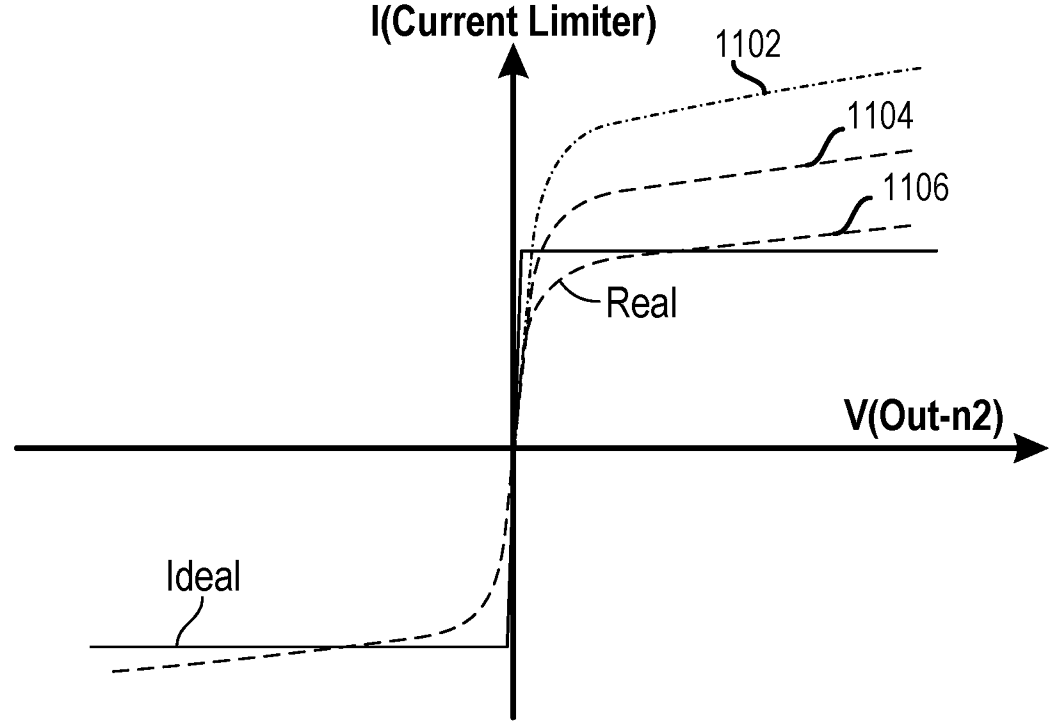
FIG. 11 shows exemplary I-V curves for a current limiter of a unity buffer at different current limit levels.

FIG. 11 shows exemplary I-V curves for a current limiter of a unity buffer at different current limit levels. The level of current limiting can be set as desired for a particular buffer design. Current limiting levels 1102, 1104, 1106 are illustrated.

It should be noted that as the level of the limit current increases, the output resistance of a real current limiter decreases. For example, the resistance can be expressed as follows:

$$ro = \frac{1}{\lambda I_{drain}(V_{ds} \to 0)}$$

$$I_{drain} = \frac{1}{2} K \frac{W}{L} (V_{gs} - V_{th})^2 (1 + \lambda V_{ds})$$

As the resistance decreases, the stability of the unity buffer will decrease.

If the unity buffer load is not simply capacitive but develops a static current, then the difference between the voltage on node n2 and output voltage Out could be fairly large. However, this is not necessarily a drawback. For example, it could preserve a load that includes one memory cell and thus limit wear-out of the memory cell.

Figure 12:
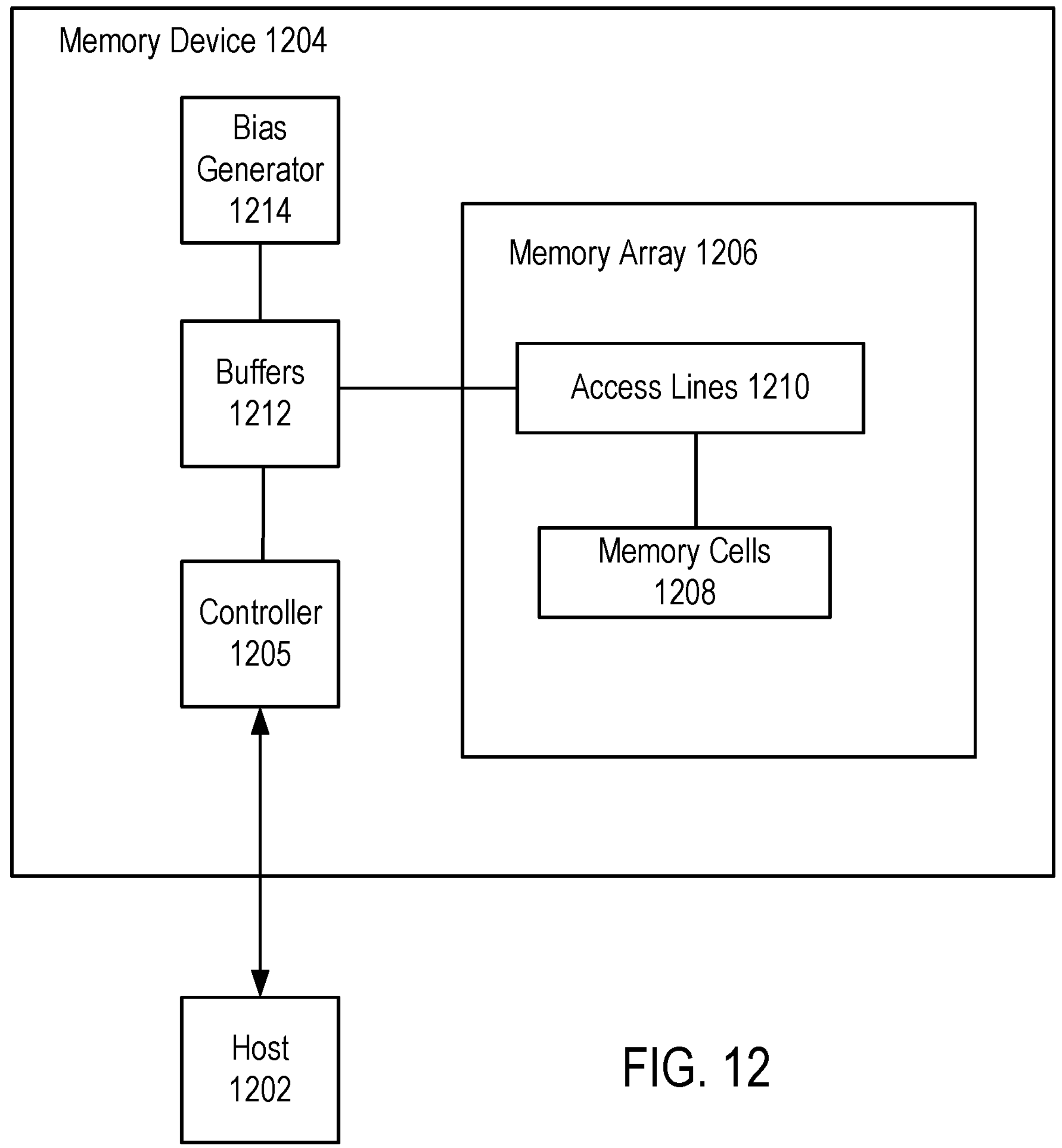
FIG. 12 shows a memory device having buffers that drive access lines in a memory array, in accordance with some embodiments.

FIG. 12 shows a memory device 1204 having buffers 1212 that drive access lines 1210 in a memory array 1206, in accordance with some embodiments. Operations on memory device 1204 are controlled by controller 1205. Controller 1205 receives commands from host 1202. These commands include, for example, read and write commands.

Access lines 1210 are used to access various memory cells 1208. For example, the memory cells 1208 are accessed for programming or reading during write or read operations managed by controller 1205.

In response to receiving the commands, controller 1205 can perform various actions. For example, in response to receiving a read or write command, controller 1205 generates control signals that are provided as inputs to buffers 1212. In one example, the control signal is input signal IN+of the buffer of FIG. 8.

Buffers 1212, in response receiving control signals from controller 1205, generate output signals used to drive access lines 1210. One example, buffer 1212 provides an output Out to drive a capacitive load CL (e.g., of an access line 1210), as illustrated in FIG. 8.

Bias generator 1214 provides current for operating buffers 1212. In one example, bias generator 1214 includes transistors 204, 206, Mpu of the unity buffer illustrated in FIG. 2.

Figure 13:
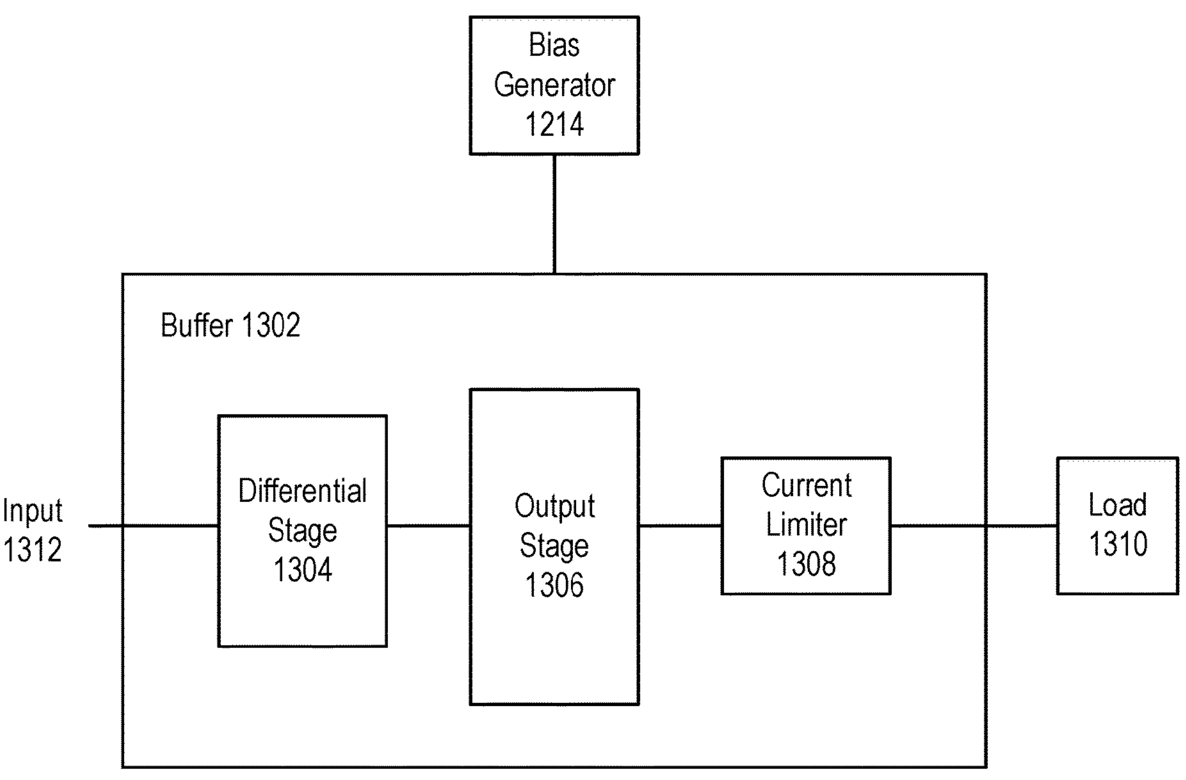
FIG. 13 shows a buffer having a current limiter coupled to an output stage of the buffer, in accordance with some embodiments.

FIG. 13 shows a buffer 1302 having a current limiter 1308 coupled to an output stage 1306 of the buffer 1302, in accordance with some embodiments. Buffer 1302 includes differential stage 1304 that receives input 1312. In one example, input 1312 is input IN+of FIG. 8, and current limiter 1308 is current limiter 802.

Differential stage 1304 provides an output responsive to input 1312. Output stage 1306 receives the output from differential stage 1304. For unity buffer operation, output stage 1306 generates an output proportional to input 1312. The generated output drives load 1310. Current flow to or from load 1310 is limited by current limiter 1308.

In one example, current limiter 1308 limits a discharge current from load CL as illustrated in FIG. 8. In one example, output stage 1306 includes pull-down transistor Mpd. In one example, differential stage 1304 includes transistors Md1, Md2, Mm1, Mm2.

Figure 14:
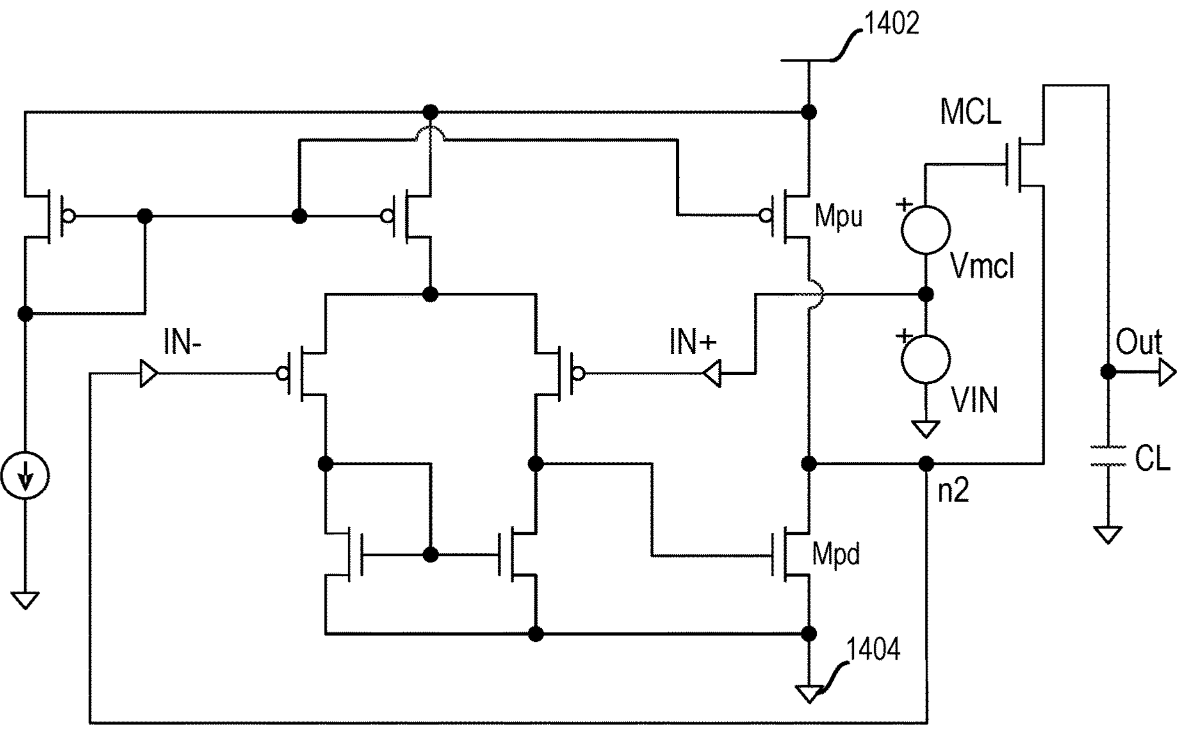
FIG. 14 shows a unity buffer having a current limiter controlled by a signal from a constant voltage source, in accordance with some embodiments.

FIG. 14 shows a unity buffer having a current limiter controlled by a signal from a constant voltage source, in accordance with some embodiments. Transistor MCL acts as a current limiter. Transistor MCL is an example of current limiter 802 of FIG. 8.

A positive voltage source 1402 is coupled to transistor Mpu. A negative voltage source 1404 (e.g., ground) is coupled to transistor Mpd.

Transistor MCL has a gate to source voltage driven by a constant voltage source Vmcl. For example, Vgs=VIN+Vmcl−V(n2)=VIN+Vmcl−VIN=Vmcl, as per the feedback effect on the inverting and non-inverting inputs. Based on driving this voltage Vgs to transistor MCL, in one example, a limit current can be expressed as follows:

$$Id^{Max} \sim 2\mu_n C_{ox} \frac{W}{L}(Vmcl - V_{th})^2$$

In one embodiment, a voltage generator configured to provide voltage Vmcl is supplied by a subcircuit of a memory device that is separate from the unity buffer(s). This subcircuit distributes voltage Vmcl to various instances of the unity buffer in the memory device.

Figure 15:
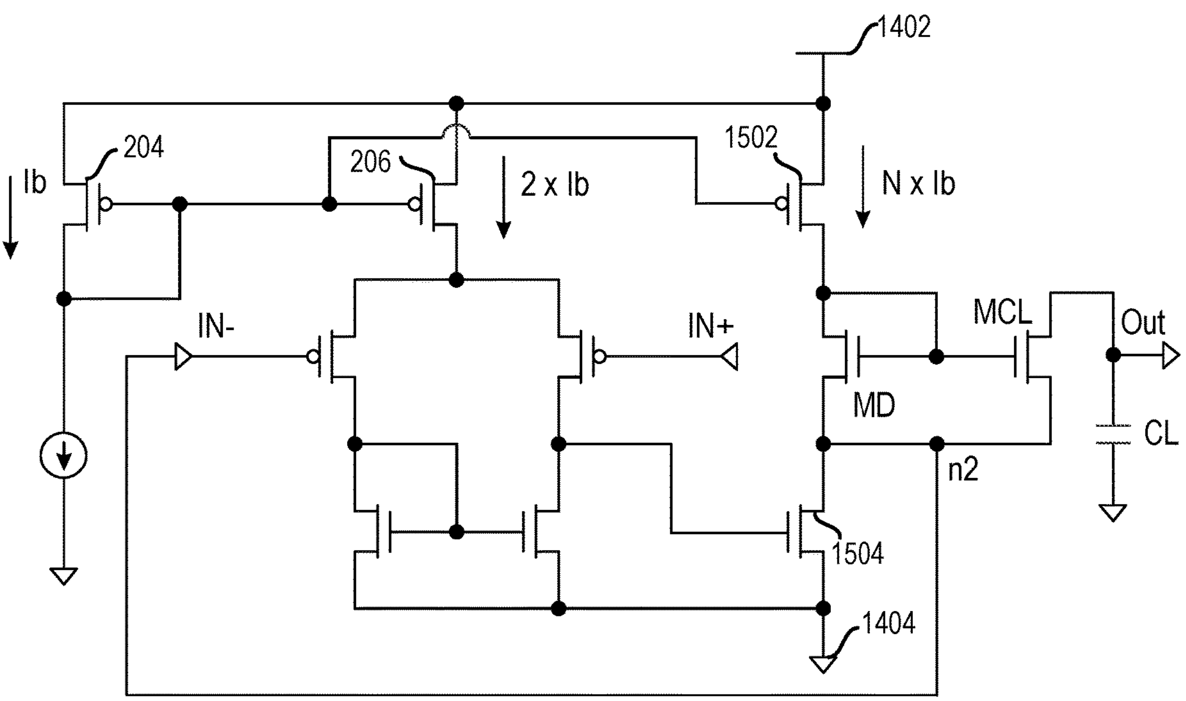
FIG. 15 shows a unity buffer having a current limiter controlled by a signal from a diode-connected transistor, in accordance with some embodiments.

FIG. 15 shows a unity buffer having a current limiter controlled by a signal from a diode-connected transistor MD, in accordance with some embodiments. Transistor MCL acts as a current limiter. Transistor MCL is an example of current limiter 802 of FIG. 8.

Transistor MCL is driven at the same gate voltage (Vgs) as for diode-connected transistor MD. Transistor MD has a bias that is the current N×Ib provided from transistor 1502. The reference current Ib is mirrored from transistor 204. In one example, transistor MCL drives load CL at a maximum mirrored current equal to N×Ib (this ignores second order effects) for equal channel widths of transistors MD and MCL.

Other maximum current levels for transistor MCL can be set by varying the ratio of channel widths for transistors MD and MCL (e.g., assuming channel lengths are drawn for layout equally). It is noted that this implementation of FIG. 15 is self-biased as contrasted to the implementation of FIG. 14.

Pull-up transistor 1502 is coupled between positive voltage source 1402 and a first current terminal of transistor MD. Pull-down transistor 1504 is coupled between a second current terminal of transistor MD and negative voltage source 1404.

For the above implementations of FIGS. 14 and 15, a desired current limit level can be set by design choice. For example, the level can be set to provide desired response speed while minimizing undershoots.

In one embodiment, in the recovery phase for the unity buffer (e.g., used to reset the buffer for a next read or write operation), when the input signal (e.g., IN+) goes from low to high, transistor MCL no longer works as a clamper. Instead, transistor MCL works, for example, as a source follower (e.g., while load CL is charged again by pull-up transistor 1502. The upward rising ramp can be fairly slow because it is limited, for example, by the current (e.g., N×Ib) supplied from p-channel pull-up transistor 1502. Thus, the unity buffer has a preferential sweep direction of high to low.

Figure 16:
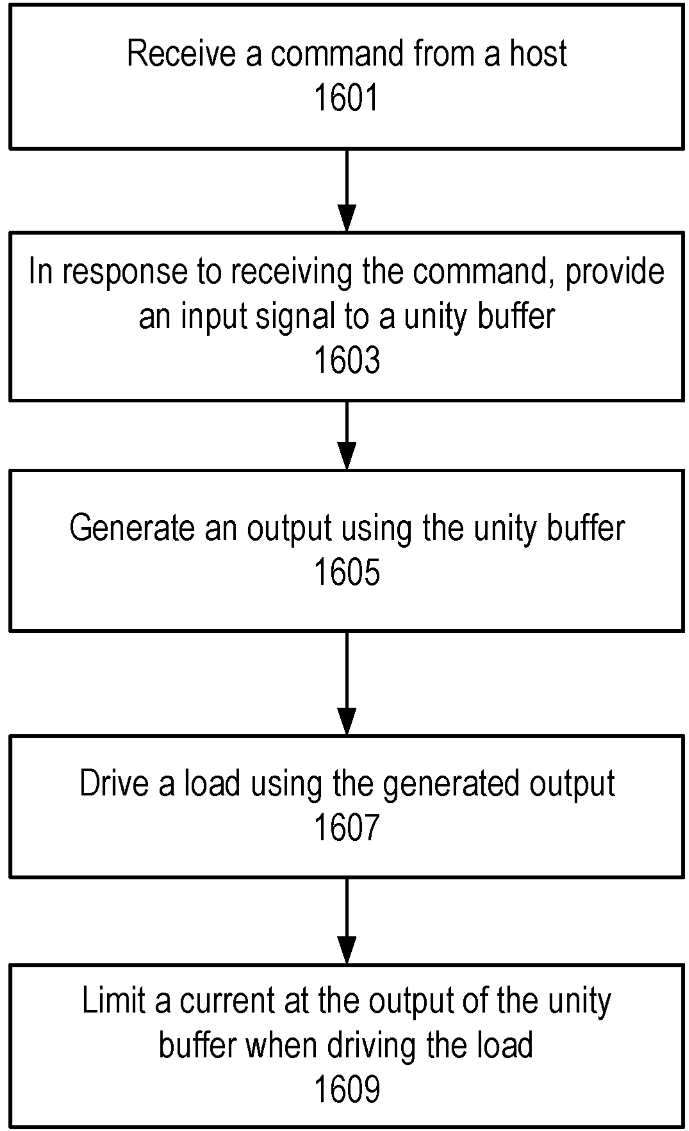
FIG. 16 shows a method for limiting current when driving a load using a unity buffer, in accordance with some embodiments.

FIG. 16 shows a method for limiting current when driving a load using a unity buffer, in accordance with some embodiments. For example, the method of FIG. 16 can be implemented in the system of FIG. 12.

The method of FIG. 16 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 16 is performed at least in part by one or more processing devices (e.g., controller 1205 of FIG. 12).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1601, a command is received from a host. In one example, a read command is received by controller 1205 from host 1202.

At block 1603, in response to receiving the command, an input signal is provided to a unity buffer. In one example, controller 1205 changes an input signal communicated to a buffer 1212 in response to receiving the read command. The input signal is changed to decrease the voltage on an access line 1210 as part of a read operation to read data stored in a memory cell 1208.

At block 1605, an output is generated using the unity buffer. In one example, output stage 1306 generates an amplified output in response to a change of voltage on input 1312.

At block 1607, a load is driven using the generated output. In one example, buffer 1302 discharges load 1310 using output stage 1306.

At block 1609, a current at the output of the unity buffer is limited when driving the load. In one example, the current is limited by current limiter 802, 1308. Other types of current limiters than those shown in FIGS. 14 and 15 can be used in other embodiments.

In one embodiment, an apparatus comprises: a memory array (e.g., 1206) including memory cells; access lines (e.g., 1210) configured to access the memory cells; and a buffer (e.g., 1212). The buffer comprises: a differential stage having an input; an output stage having an output responsive to the input; and a current limiter (e.g., 802, 1308) configured to couple the output to at least one first access line, wherein the current limiter is configured to limit current flow associated with driving a voltage on the first access line.

In one embodiment, the output stage comprises a pull-down transistor (e.g., transistor Mpd) coupled between the current limiter and a negative voltage source (e.g., 1404, or ground), and the pull-down transistor has a gate coupled to an output of the differential stage.

In one embodiment, the pull-down transistor is configured to discharge a capacitive load (e.g., CL) of the first access line so that a voltage on the first access line decreases; and the current limiter limits the current flow when discharging the capacitive load.

In one embodiment, the apparatus further comprises a pull-up transistor (e.g., transistor Mpu) coupled between the current limiter and a positive voltage source (e.g., 1402).

In one embodiment, the apparatus further comprises a diode-connected transistor (e.g., 204), wherein a gate of the pull-up transistor is coupled to a gate of the diode-connected transistor to control a current through the pull-up transistor.

In one embodiment, the apparatus further comprises a p-channel transistor (e.g., 206) coupled to provide current to the differential stage, wherein a gate of the p-channel transistor is coupled to the gate of the diode-connected transistor to control the current to the differential stage.

In one embodiment, the p-channel transistor and the diode-connected transistor are configured in a bias generator (e.g., 1214), and the bias generator is configured to provide operating current to a plurality of buffers of a memory device (e.g., 1204).

In one embodiment, the apparatus further comprises a controller (e.g., 1205) configured to vary a voltage on the input to the differential stage when accessing one or more memory cells in the memory array.

In one embodiment, the buffer does not include a compensation network coupled between the differential stage and the output stage.

In one embodiment, the input to the differential stage is a non-inverting input (e.g., IN+); and the buffer is configured to operate as a unity buffer having the output of the output stage coupled to an inverting input (e.g., IN−) of the differential stage.

In one embodiment, the current limiter comprises a transistor (e.g., MCL) coupled between the output of the output stage and the first access line, and the transistor has a gate coupled to the input of the differential stage.

In one embodiment, the apparatus further comprises a voltage generator (e.g., Vmcl) coupled between the input of the differential stage and the gate of the transistor, wherein the voltage generator is configured to provide a constant voltage.

In one embodiment, the output stage comprises a diode-connected transistor (e.g., MD) coupled between a positive voltage source and the output of the output stage; the current limiter comprises a first transistor (e.g., MCL) coupled between the output of the output stage and the first access line; and a gate of the diode-connected transistor is coupled to a gate of the first transistor.

In one embodiment, the memory cells are chalcogenide cells.

In one embodiment, an apparatus comprises: a differential transistor pair including a first transistor (e.g., Md1) having a gate coupled to an inverting input, and a second transistor (e.g., Md2) having a gate coupled to a non-inverting input; an n-channel transistor (e.g., Mpd) having a gate coupled to a current terminal (e.g., node n1) of the second transistor; and a current limiter coupled to a current terminal (e.g., node n2) of the n-channel transistor, wherein the current limiter is configured to limit current flow when driving a load coupled to an output of the current limiter, and wherein the current terminal of the n-channel transistor is coupled to provide a feedback signal to the inverting input.

In one embodiment, the apparatus further comprises a p-channel transistor (e.g., Mpu) coupled between the current terminal of the n-channel transistor and a positive voltage source.

In one embodiment, the apparatus further comprises a diode-connected transistor (e.g., p-channel transistor of bias generator) configured to provide a reference current (e.g., Ib), wherein a gate of the diode-connected transistor is coupled to a gate of the p-channel transistor (e.g., Mpu).

In one embodiment, the current limiter comprises a first transistor (e.g., MCL) having a gate coupled to a constant voltage source (e.g., Vmcl); and the first transistor has a first current terminal (e.g., source) coupled to the current terminal of the n-channel transistor, and a second current terminal (e.g., drain) configured to provide the output for driving the load (e.g., CL).

In one embodiment, the first transistor is an n-channel transistor.

In one embodiment, the apparatus further comprises a p-channel transistor (e.g., Mpu) and a diode-connected transistor (e.g., MD) connected in series, wherein: the diode-connected transistor is coupled between the p-channel transistor and the current terminal (e.g., node n2) of the n-channel transistor (e.g., Mpd); the current limiter comprises a first transistor (e.g., MCL) having a first current terminal (e.g., source) coupled to the current terminal of the n-channel transistor, and having a second current terminal (e.g., drain) configured to drive the load (e.g., CL); and a gate of the first transistor is coupled to a gate of the diode-connected transistor.

In one embodiment, a method comprises: receiving, by a controller, a read or write command from a host; in response to receiving the command, providing an input on a non-inverting input (e.g., IN+) of a unity buffer; generating, by the unity buffer, an output (e.g., voltage on node n2) proportional to the input; driving a voltage on an access line (e.g., CL) using the generated output, wherein the access line is configured to access at least one memory cell of a memory array; and limiting, by a current limiter (e.g., 802) coupled in series between the output of the unity buffer and the access line, a current flow when driving the voltage.

In one embodiment, the current limiter comprises a transistor (e.g., transistor MCL), and the current flow is limited by controlling a voltage on a gate of the transistor.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:

a memory array including memory cells;

access lines configured to access the memory cells; and a buffer comprising:

a differential stage having an input, the input to the differential stage is a non-inverting input;

an output stage having an output responsive to the input; and a current limiter configured to couple the output to at least one first access line, wherein the current limiter is configured to limit current flow associated with driving a voltage on the first access line.

2. The apparatus of claim 1, wherein the output stage comprises a pull-down transistor coupled between the current limiter and a negative voltage source.

3. The apparatus of claim 2, wherein:

the pull-down transistor is configured to discharge a capacitive load of the first access line so that a voltage on the first access line decreases; and the current limiter limits the current flow when discharging the capacitive load.

4. The apparatus of claim 2, further comprising a pull-up transistor coupled between the current limiter and a positive voltage source.

5. The apparatus of claim 4, further comprising a diode-connected transistor, wherein a gate of the pull-up transistor is coupled to a gate of the diode-connected transistor to control a current through the pull-up transistor.

6. The apparatus of claim 5, further comprising a p-channel transistor coupled to provide current to the differential stage, wherein a gate of the p-channel transistor is coupled to the gate of the diode-connected transistor to control the current to the differential stage.

7. The apparatus of claim 6, wherein the p-channel transistor and the diode-connected transistor are configured in a bias generator, and the bias generator is configured to provide operating current to a plurality of buffers of a memory device.

8. The apparatus of claim 1, further comprising a controller configured to vary a voltage on the input to the differential stage when accessing one or more memory cells in the memory array.

9. The apparatus of claim 1, wherein the buffer does not include a compensation network coupled between the differential stage and the output stage.

10. The apparatus of claim 1, wherein;

the buffer is configured to operate as a unity buffer having the output of the output stage coupled to an inverting input of the differential stage.

11. The apparatus of claim 1, wherein the current limiter comprises a transistor coupled between the output of the output stage and the first access line, and wherein the transistor has a gate coupled to the input of the differential stage.

12. The apparatus of claim 11, further comprising a voltage generator coupled between the input of the differential stage and the gate of the transistor, wherein the voltage generator is configured to provide a constant voltage.

13. The apparatus of claim 1, wherein:

the output stage comprises a diode-connected transistor coupled between a positive voltage source and the output of the output stage;

the current limiter comprises a first transistor coupled between the output of the output stage and the first access line; and a gate of the diode-connected transistor is coupled to a gate of the first transistor.

14. An apparatus comprising:

a differential transistor pair including a first transistor having a gate coupled to an inverting input, and a second transistor having a gate coupled to a non-inverting input;

an n-channel transistor having a gate coupled to a current terminal of the second transistor; and a current limiter coupled to a current terminal of the n-channel transistor, wherein the current limiter is configured to limit current flow when driving a load coupled to an output of the current limiter, and wherein the current terminal of the n-channel transistor is coupled to provide a feedback signal to the inverting input.

15. The apparatus of claim 14, further comprising a p-channel transistor coupled between the current terminal of the n-channel transistor and a positive voltage source.

16. The apparatus of claim 15, further comprising a diode-connected transistor configured to provide a reference current, wherein a gate of the diode-connected transistor is coupled to a gate of the p-channel transistor.

17. The apparatus of claim 14, wherein:

the current limiter comprises a first transistor having a gate coupled to a constant voltage source; and the first transistor has a first current terminal coupled to the current terminal of the n-channel transistor, and a second current terminal configured to provide the output for driving the load.

18. The apparatus of claim 14, further comprising a p-channel transistor and a diode-connected transistor connected in series, wherein:

the diode-connected transistor is coupled between the p-channel transistor and the current terminal of the n-channel transistor;

the current limiter comprises a first transistor having a first current terminal coupled to the current terminal of the n-channel transistor, and having a second current terminal configured to drive the load; and a gate of the first transistor is coupled to a gate of the diode-connected transistor.

19. A method comprising:

forming a communication interface configured to receive a read or write command from a host;

forming a unity buffer in a semiconductor substrate, the unity buffer configured to generate an output proportional to an input;

forming circuitry in the semiconductor substrate, the circuitry configured to, in response to receiving the command, provide an input on a non-inverting input of the unity buffer;

forming a three-dimensional memory array above the semiconductor substrate, the memory array comprising at least one memory cell;

forming an access line in the memory array, wherein the access line is configured to access the memory cell of the memory array;

forming circuitry in the semiconductor substrate configured to drive a voltage on the access line using the generated output; and forming a current limiter configured to limit a current flow when driving the voltage, wherein the current limiter is coupled in series between the output of the unity buffer and the access line;

wherein the current limiter comprises a transistor coupled between the output of the unity buffer and the access line, and wherein the transistor has a gate coupled to the input of a differential stage.

20. The method of claim 19, wherein the current limiter comprises a transistor, and the current limiter is further configured to limit current flow by controlling a voltage on a gate of the transistor.

* * * * *